(12) United States Patent
Cheng et al.

(10) Patent No.: US 12,014,788 B2
(45) Date of Patent: Jun. 18, 2024

(54) MEMORY ARRAY DETECTION CIRCUIT AND DETECTION METHOD, AND MEMORY

(71) Applicant: CHANGXIN MEMORY TECHNOLOGIES, INC., Hefei (CN)

(72) Inventors: Weijie Cheng, Hefei (CN); Onegyun Na, Hefei (CN); Liuyan Hong, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 101 days.

(21) Appl. No.: 17/813,597

(22) Filed: Jul. 19, 2022

(65) Prior Publication Data
US 2023/0352111 A1 Nov. 2, 2023

Related U.S. Application Data

(63) Continuation of application No. PCT/CN2022/092919, filed on May 16, 2022.

(30) Foreign Application Priority Data

Apr. 29, 2022 (CN) .......................... 202210474922.0

(51) Int. Cl.
*G11C 29/08* (2006.01)
*G11C 29/04* (2006.01)

(52) U.S. Cl.
CPC ...... *G11C 29/08* (2013.01); *G11C 2029/0401* (2013.01)

(58) Field of Classification Search
CPC ...................................................... G11C 29/08
See application file for complete search history.

(56) References Cited

U.S. PATENT DOCUMENTS

| | | | | |
|---|---|---|---|---|
| 5,442,641 A | * | 8/1995 | Beranger | G11C 29/40 |
| | | | | 714/719 |
| 5,712,827 A | * | 1/1998 | Ogihara | G11C 11/4096 |
| | | | | 365/230.02 |
| 5,982,684 A | | 11/1999 | Schwartzlow | |
| 6,058,056 A | * | 5/2000 | Beffa | G11C 29/40 |
| | | | | 365/201 |
| 6,452,844 B2 | | 9/2002 | Koshikawa | |
| 2002/0056062 A1 | * | 5/2002 | Hartmann | G11C 29/40 |
| | | | | 714/719 |

(Continued)

FOREIGN PATENT DOCUMENTS

| CN | 101226777 A | 7/2008 |
|---|---|---|
| CN | 104094357 A | 10/2014 |

(Continued)

*Primary Examiner* — Douglas King
(74) *Attorney, Agent, or Firm* — Syncoda LLC; Feng Ma

(57) ABSTRACT

A memory array detection circuit includes: a memory array including multiple memory cells; a write circuit, connected to the memory array and configured to write same initial data into each memory cell of the memory array; a read circuit, connected to the memory array and configured read the data stored in each memory cell of the memory array; and a data compression circuit, connected to the read circuit and configured to: compare the data read from the multiple memory cells, and detect whether the memory array is defective according to whether the read data are identical.

10 Claims, 6 Drawing Sheets

(56) References Cited

U.S. PATENT DOCUMENTS

| | | | | |
|---|---|---|---|---|
| 2002/0073367 A1* | 6/2002 | Hartmann | ............... | G11C 29/26 |
| | | | | 714/719 |
| 2007/0288810 A1* | 12/2007 | Sumimoto | ............. | G11C 29/40 |
| | | | | 714/719 |
| 2008/0130386 A1* | 6/2008 | Pyeon | ................... | G11C 29/003 |
| | | | | 365/201 |
| 2008/0209284 A1* | 8/2008 | Louie | ...................... | G11C 29/48 |
| | | | | 714/718 |
| 2009/0044063 A1* | 2/2009 | Cho | ....................... | G11C 29/56 |
| | | | | 714/724 |
| 2015/0063045 A1 | 3/2015 | Hickey et al. | | |

FOREIGN PATENT DOCUMENTS

| | | |
|---|---|---|
| CN | 112582017 A | 3/2021 |
| JP | 2020198142 A | 12/2020 |

* cited by examiner

MEMORY ARRAY DETECTION CIRCUIT AND DETECTION METHOD, AND MEMORY

CROSS-REFERENCE TO RELATED APPLICATIONS

This is a continuation of International Application No. PCT/CN2022/092919 filed on May 16, 2022, which claims priority to Chinese Patent Application No. 202210474922.0 filed on Apr. 29, 2022. The disclosures of the above-referenced applications are hereby incorporated by reference in their entirety.

BACKGROUND

Semiconductor memories are widely used to store information in various kinds of electronic devices such as computers, wireless communication devices, cameras, and digital displays. Memory cells within the semiconductor memory are programmed to be in various states so as to store information.

Generally, the semiconductor memory contains a large array of memory cells which are subdivided into several equally sized, individually and internally addressable sub-arrays. Dividing the large array into sub-arrays facilitates the fabrication of components. These sub-arrays of memory cells are all connected to the same or similar internal address lead wires so that each sub-array is accessed in a similar manner.

SUMMARY

The disclosure relates to semiconductor memory technologies, and in particular, to a memory array detection circuit and detection method, and a memory.

According to a first aspect of embodiments of the disclosure, there is provided a memory array detection circuit, including: a memory array including multiple memory cells; a write circuit, connected to the memory array and configured to write same initial data into each memory cell of the memory array; a read circuit, connected to the memory array and configured to read data stored in each memory cell of the memory array; and a data compression circuit, connected to the read circuit and configured to: compare data read from the multiple memory cells, and detect whether the memory array is defective according to whether the read data are identical.

According to a second aspect of embodiments of the disclosure, there is provided a memory array detection method, including: writing, by a write circuit, same initial data into each memory cell of the memory array; reading, by a read circuit, data stored in each memory cell of the memory array; comparing, by a data compression circuit, data read from memory cells of the memory array, and detecting whether the memory array is defective according to whether the read data are identical.

According to a third aspect of embodiments of the disclosure, there is provided a memory, including a memory array detection circuit, the memory array detection circuit comprising: a memory array comprising multiple memory cells; a write circuit, connected to the memory array and configured to write same initial data into each memory cell of the memory array; a read circuit, connected to the memory array and configured to read data stored in each memory cell of the memory array; and a data compression circuit, connected to the read circuit and configured to: compare data read from the multiple memory cells, and detect whether the memory array is defective according to whether the read data are identical.

BRIEF DESCRIPTION OF THE DRAWINGS

In order to more clearly illustrate the embodiments of the disclosure or technical solutions in the traditional technology, the accompanying drawings required in the embodiments will be briefly introduced below. Obviously, the drawings in the following description are only some implementations of the disclosure. For example, for those of ordinary skill in the art, other drawings can also be obtained based on these drawings without any creative effort.

DESCRIPTION OF REFERENCE SIGNS

Figure 1:
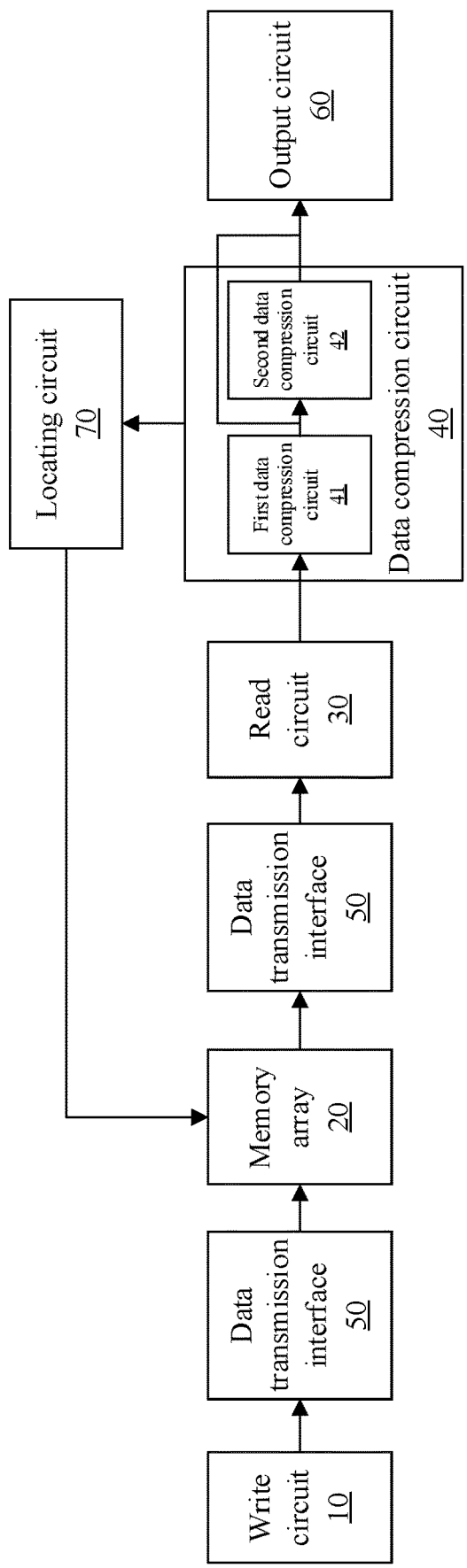
FIG. 1 illustrates a structural block diagram of a memory array detection circuit according to embodiments of the disclosure.

10—Write circuit.
20—Memory array; 21—Memory matrix; 201—Memory sub-array; 211—First memory sub-array group; 212—Second memory sub-array group; 213—Third memory sub-array group; and 214—Fourth memory sub-array group.
30—Read circuit.
40—Data compression circuit; 41—First data compression circuit; and 42—Second data compression circuit.
50—Data transmission interface; 501—Transmission sub-interface; 51—First transmission sub-interface; and 52—Second transmission sub-interface.
60—Output circuit.
70—Locating circuit.

DETAILED DESCRIPTION

Exemplary embodiments of the disclosure will be described in more detail below with reference to the accompanying drawings. While exemplary embodiments of the disclosure are shown in the drawings, it should be understood that the disclosure may be embodied in various forms and should not be limited by the specific embodiments set forth herein. Rather, these embodiments are provided so that the disclosure will be more thoroughly understood, and will fully convey the scope of the disclosure to those skilled in the art.

In the following description, numerous specific details are set forth in order to provide a more thorough understanding of the disclosure. However, it will be apparent to those skilled in the art that the disclosure may be practiced without one or more of these details. In other instances, some technical features that are well known in the art have not been described, in order to avoid obscuring the disclosure.

That is, not all features of an actual embodiment are described herein, and well-known functions and constructions are not described in detail.

In the drawings, the sizes of layers, regions, elements, and their relative sizes may be exaggerated for clarity. The same reference signs refer to the same elements throughout.

It will be understood that when an element or layer is referred to as being "on", "adjacent to", "connected to" or "coupled to" other elements or layers, it can be directly on the other elements or layers, adjacent thereto, connected or coupled to other elements or layers, or there are intervening elements or layers present. In contrast, when an element is referred to as being "directly on", "directly adjacent to", "directly connected to" or "directly coupled to" other elements or layers, there are no intervening elements or layers present. It will be understood that, although the terms "first", "second", "third", etc., may be used to describe various elements, components, regions, layers and/or sections, these elements, components, regions, layers and/or sections should not be limited by these terms. These terms are only used to distinguish one element, component, region, layer or section from another element, component, region, layer or section. Thus, a first element, a first component, a first region, a first layer or a first section discussed below could be termed a second element, a second component, a second region, a second layer or a second section without departing from the teachings of the disclosure. The discussion of a second element, a second component, a second region, a second layer or a second section does not imply that the first element, the first component, the first region, the first layer or the first section is necessarily present in the disclosure.

Spatial relational terms such as "under", "below", "beneath", "underneath", "on", "above", etc., are used herein for convenience of the description of the relationship of one element or feature with other elements or features shown in the figures. It should be understood that the terms for spatial relationships are intended to encompass different orientations of the apparatus in use and operation in addition to the orientation shown in the figures. For example, if the apparatus in the figures is turned over, then elements or features described as "below" or "underneath" or "beneath" other elements or features before the turn over would then be oriented "above" the other elements or features. Thus, the exemplary terms "below" and "under" can encompass both an orientation of above and below. The apparatus may be otherwise oriented (rotated 90 degrees or at other orientations) and the spatial descriptors used herein interpreted accordingly.

The terminology used herein is for the purpose of describing particular embodiments only and is not intended to be limiting of the disclosure. As used herein, the singular forms "a", "an" and "said/the" are intended to include the plural forms as well, unless it is otherwise indicated in the context clearly. It should also be understood that the terms "compose" and/or "include", when used in this specification, identify the presence of stated features, integers, operations, operations, elements and/or components, but do not exclude presence or addition of one or more other features, integers, operations, operations, elements, parts and/or groups. As used herein, the term "and/or" includes any and all combinations of the associated listed items.

For a thorough understanding of the disclosure, detailed operations and detailed structures will be presented in the following description in order to explain the technical solutions of the disclosure. Preferred embodiments of the disclosure are described in detail below. However, it should be understood that the disclosure has other embodiments in addition to these detailed descriptions.

Defects occur in the process of manufacturing and designing a memory cell array. Therefore, it is important to determine types and locations of the defects on the memory cell array through tests.

Embodiments of the disclosure provide a memory array detection circuit. FIG. 1 illustrates a structural block diagram of a memory array detection circuit according to embodiments of the disclosure.

Referring to FIG. 1, the memory array detection circuit includes a memory array 20, a write circuit 10, a read circuit 30, and a data compression circuit 40.

The memory array 20 includes multiple memory cells.

The write circuit 10 is connected to the memory array 20, and is configured to write same initial data into each memory cell of the memory array 20.

The read circuit 30 is connected to the memory array 20, and is configured to read data stored in each memory cell of the memory array 20.

The data compression circuit 40 is connected to the read circuit 30, and is configured to: compare data read from the multiple memory cells, and detect whether the memory array 20 is defective according to whether the read data are identical.

In the embodiments of the disclosure, at first, the same initial data is written into each memory cell of the memory array, and then the data in each memory cell of the memory array is read. The read data are compared by the data compression circuit, and whether a defect exists in the memory array is determined according to a comparison result, so as to correct the defect.

Figure 2:
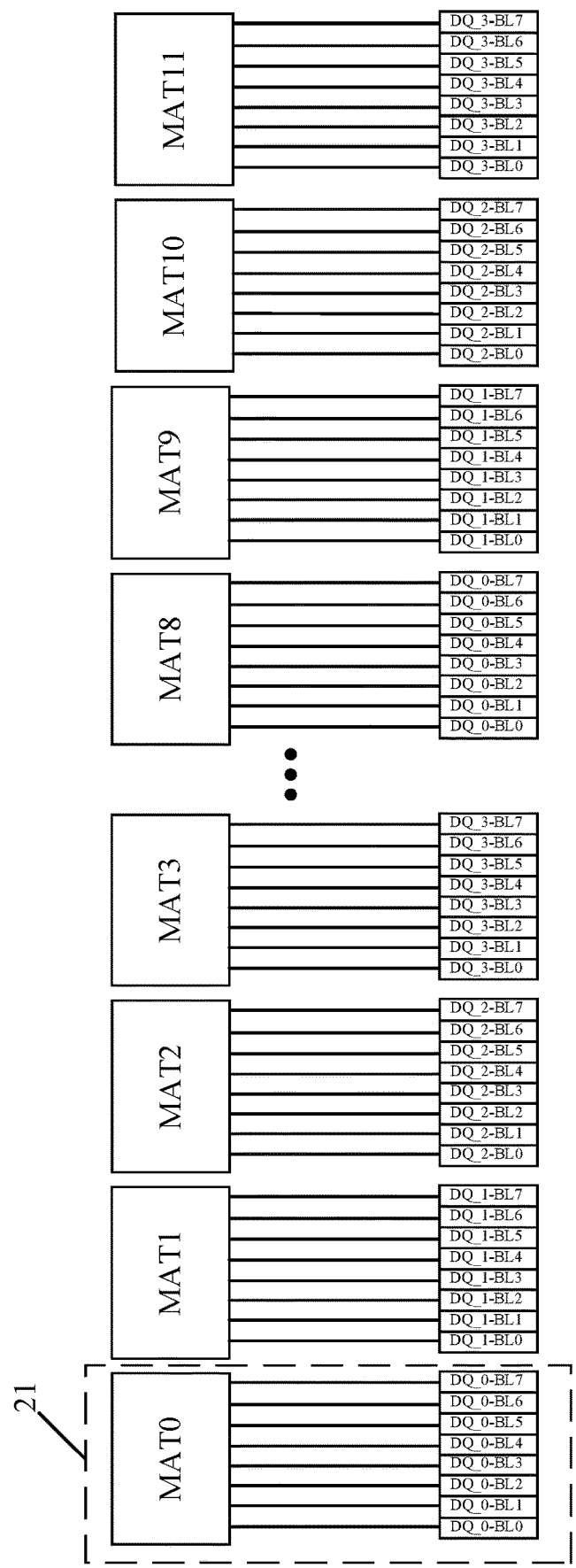
FIG. 2 illustrates a schematic structural diagram of memory matrixes according to embodiments of the disclosure.
Figure 3:
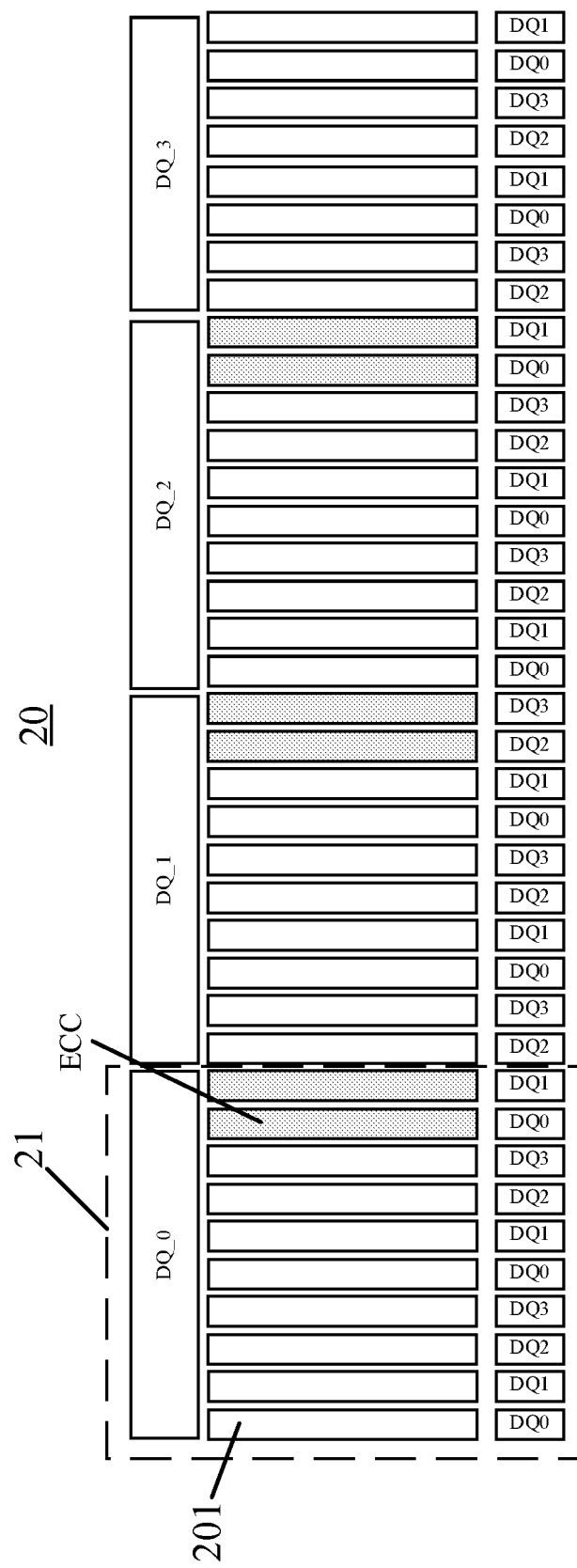
FIG. 3 illustrates another schematic structural diagram of a memory array according to embodiments of the disclosure.

FIG. 2 illustrates a schematic structural diagram of a memory matrix according to embodiments of the disclosure, and FIG. 3 illustrates a schematic structural diagram of a memory array according to embodiments of the disclosure.

As illustrated in FIG. 2 and FIG. 3, the memory array 20 includes multiple memory matrixes 21. Each of the multiple memory matrixes 21 includes multiple memory sub-arrays 201. Each of the multiple memory sub-arrays includes multiple memory cells arranged in an array. Each memory cell includes a 1T1C memory structure. The memory matrix 21 is a MAT as shown in FIG. 2. In the embodiment shown in FIG. 2, there are 12 memory matrixes in total, i.e., MAT0, MAT1 . . . MAT11. However, in other embodiments, there can be another number of memory matrixes, and the number of memory matrixes disclosed in the embodiments of the disclosure forms no limitation to other embodiments.

In an embodiment, the multiple memory matrixes 21 are divided into at least four groups. For example, as shown in FIG. 2, MAT0 to MAT11 are divided into four groups, and data transmission ports corresponding to each group include DQ_0, DQ_1, DQ_2 and DQ_3. DQ_0 corresponds to MAT0, MAT4 and MAT8, DQ_1 corresponds to MAT1, MAT5 and MAT9, DQ_2 corresponds to MAT2, MAT6 and MAT10, and DQ_3 corresponds to MAT3, MAT7 and MAT11. As shown in FIG. 3, each group of memory matrixes 21 is shown to include only one MAT, that is, each of DQ_0, DQ_1, DQ_2 and DQ_3 is shown to correspond to one MAT. However, in other embodiments, there may be another number of memory matrixes in each group, and the number of memory matrixes in each group disclosed in the embodiments of the disclosure forms no limitation to other embodiments.

As shown in FIG. 2, with MAT0 as an example, the memory matrix MAT0 includes multiple memory sub-arrays, and each memory sub-array corresponds to one DQ_0-

BLn (n is a sign of a corresponding bit line). In the embodiment shown in FIG. 3, the multiple memory matrixes 21 further include multiple error correction bits ECC.

Figure 4:
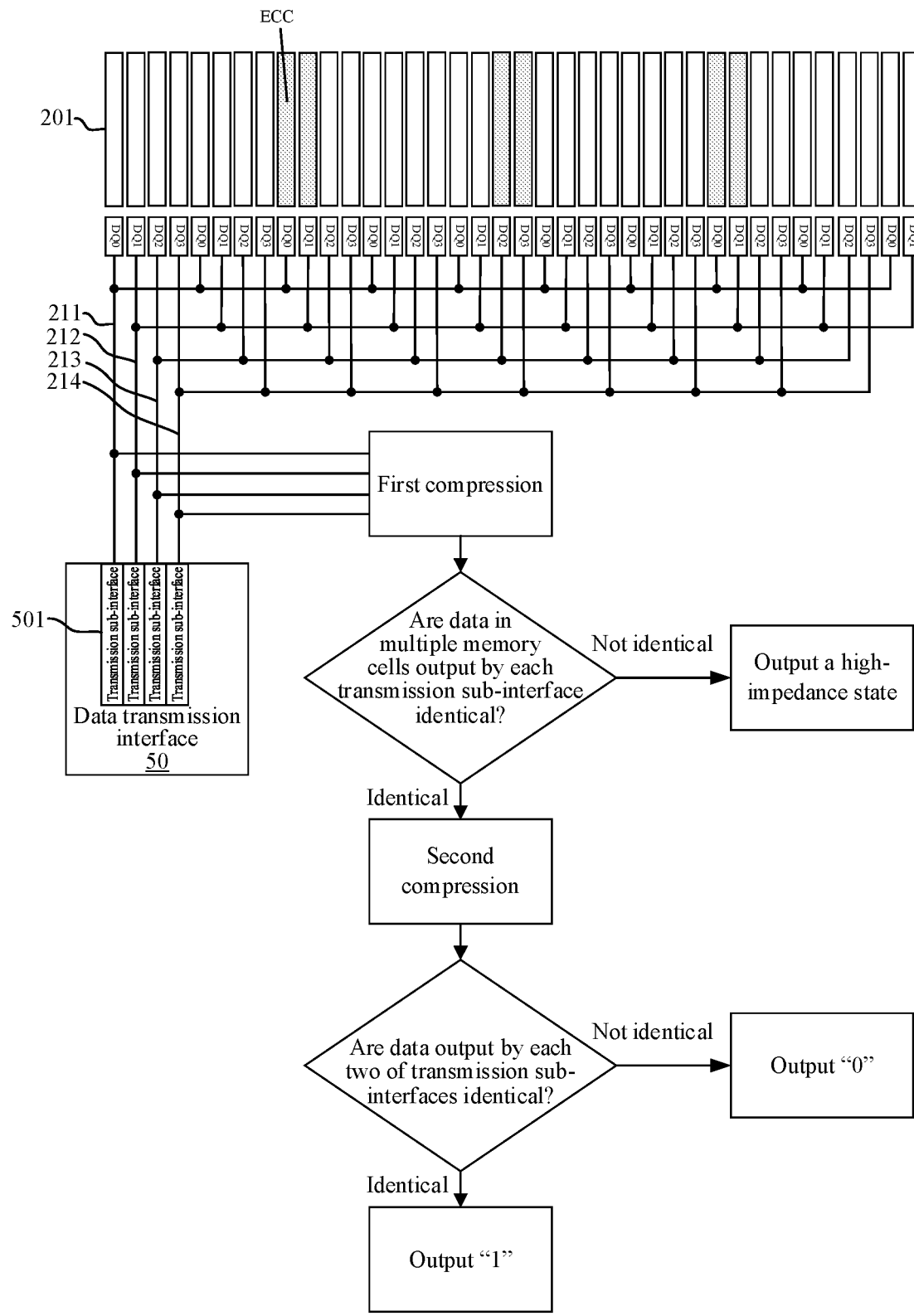
FIG. 4 illustrates another schematic structural diagram of a memory array detection circuit according to an embodiment of the disclosure.

FIG. 4 illustrates a schematic structural diagram of a memory array detection circuit according to an embodiment of the disclosure.

In an embodiment, the memory array detection circuit further includes a data transmission interface 50 through which the stored data is read. The data transmission interface 50 includes at least four transmission sub-interfaces 501.

The memory array 20 includes multiple memory matrixes 21. Each of the memory matrixes 21 includes multiple memory sub-arrays 201. Each of the multiple memory sub-arrays includes multiple memory cells. All memory sub-arrays 201 of the memory array are divided into at least four memory sub-array groups electrically connected to the at least four transmission sub-interfaces 501 in one-to-one correspondence.

As shown in FIG. 4, all the memory sub-arrays are divided into four groups which correspond to DQ0, DQ1, DQ2 and DQ3 respectively. All DQ0 correspond to a first memory sub-array group 211, all DQ1 correspond to a second memory sub-array group 212, all DQ2 correspond to a third memory sub-array group 213, and all DQ3 correspond to a fourth memory sub-array group 214. The first memory sub-array group 211, the second memory sub-array group 212, the third memory sub-array group 213, and the fourth memory sub-array group 214 are electrically connected to the corresponding transmission sub-interfaces 501 respectively. The read circuit 30 reads, through the transmission sub-interfaces 501, the stored data from the corresponding memory sub-arrays respectively, and transmits the read data to the data compression circuit 40.

In an embodiment, referring to FIG. 1 and FIG. 4, the data compression circuit 40 includes a first data compression circuit 41 and a second data compression circuit 42.

The first data compression circuit 41 is connected to the read circuit 30, and is configured to determine, for each of the at least four transmission sub-interfaces 501 whether data of multiple memory cells output by the transmission sub-interface are identical.

The second data compression circuit 42 is connected to the first data compression circuit 41, and is configured to determine whether data output by each two of the at least four transmission sub-interfaces 501 are identical.

In an embodiment, the memory array detection circuit further includes an output circuit 60. The output circuit 60 is connected to the first data compression circuit 41 and the second data compression circuit 42, and is configured to output three states according to determination results of the first data compression circuit 41 and the second data compression circuit 42.

Specifically, referring to FIG. 4, the read circuit 30 reads, through multiple transmission sub-interfaces 501, stored data from the corresponding memory sub-arrays respectively, and transmits the read data to the first data compression circuit 41. The first data compression circuit 41 compresses the stored data for the first time, and compares the data output by each of the transmission sub-interfaces 501 respectively, and determines weather data of multiple memory cells output by each transmission sub-interface 501 are identical. Specifically, it is determined whether data of multiple memory cells in the first memory sub-array group 211 corresponding to all DQ0 are identical, whether data of multiple memory cells in the second memory sub-array group 212 corresponding to all DQ1 are identical, whether data of multiple memory cells in the third memory sub-array group 213 corresponding to all DQ2 are identical, and whether data of multiple memory cells in the fourth memory sub-array group 214 corresponding to all DQ3 are identical. If it is determined that data of multiple memory cells in at least one of the first memory sub-array group 211, the second memory sub-array group 212, the third memory sub-array group 213 and the fourth memory sub-array group 214 are not identical, the output circuit 60 outputs a high-impedance state, which indicates that the memory array 20 is defective. If it is determined that the data of the multiple memory cells in each memory sub-array group are identical, further comparison is performed by the second data compression circuit 42.

The second data compression circuit 42 compresses the stored data for the second time, and compares the data output by each two of the transmission sub-interfaces 501 to determine whether the data output by the two of the transmission sub-interfaces 501 are identical. Specifically, it is determined that whether the data of multiple memory cells in each two memory sub-arrays among the first memory sub-array group 211, the second memory sub-array group 212, the third memory sub-array group 213 and the fourth memory sub-array group 214 are identical. For example, it is determined that whether the data of the multiple memory cells in the first memory sub-array group 211 are identical to those in the second memory sub-array group 212, and whether the data of the multiple memory cells in the first memory sub-array group 211 are identical to those in the third memory sub-array group 213. If it is determined that the data of multiple memory cells in each two memory sub-array groups among the first memory sub-array group 211, the second memory sub-array group 212, the third memory sub-array group 213 and the fourth memory sub-array group 214 are identical and the output data are identical to the initial data, the output circuit outputs "1", which indicates that the memory array is not defective. If it is determined that the data of multiple memory cells in at least two of the first memory sub-array group 211, the second memory sub-array group 212, the third memory sub-array group 213 and the fourth memory sub-array group 214 are not identical, the output circuit outputs "0", which indicates that the memory array is defective.

Figure 5:
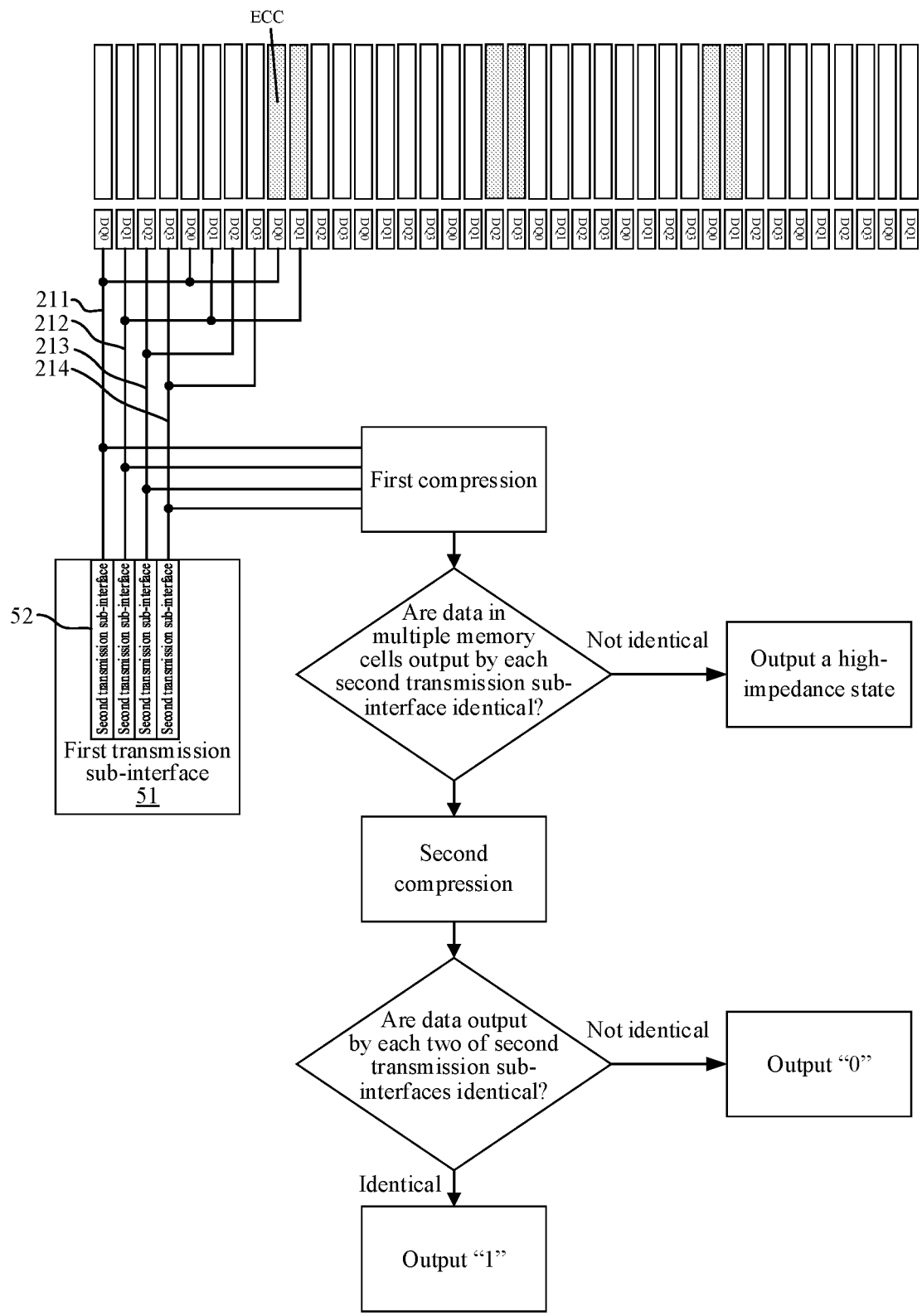
FIG. 5 illustrates a schematic structural diagram of a memory array detection circuit according to another embodiment of the disclosure.

FIG. 5 illustrates a schematic structural diagram of a memory array detection circuit according to another embodiment of the disclosure.

In an embodiment, the memory array detection circuit further includes a data transmission interface 50 through which the stored data is read. The data transmission interface 50 includes at least four first transmission sub-interfaces 51, and each first data transmission sub-interface 51 includes at least four second transmission sub-interfaces 52.

The memory array 20 includes multiple memory matrixes 21 that are divided into at least four memory matrix groups electrically connected to the at least four first transmission sub-interfaces 51 in one-to-one correspondence. Each of the multiple memory matrixes 21 includes multiple memory sub-arrays, and each of the multiple memory sub-arrays includes multiple memory cells. Multiple memory sub-arrays in each of the multiple memory matrixes 21 are divided into at least four memory sub-array groups electrically connected to corresponding second transmission sub-interfaces 52 in one-to-one correspondence.

As shown in FIG. 5, multiple memory matrixes 21 are divided into four memory matrix groups. Each memory matrix group includes one memory matrix 21. The memory matrixes 21 are electrically connected to first transmission sub-interfaces 51 in one-to-one correspondence. Multiple memory sub-arrays in each memory matrix 21 are divided into four groups which correspond to DQ0, DQ1, DQ2 and DQ3 respectively. All DQ0 correspond to the first memory sub-array group 211, all DQ1 correspond to the second memory sub-array group 212, all DQ2 correspond to the third memory sub-array group 213, and all DQ3 correspond to the fourth memory sub-array group 214. The first memory sub-array group 211, the second memory sub-array group 212, the third memory sub-array group 213 and the fourth memory sub-array group 214 in each memory matrix 21 are electrically connected to the corresponding second transmission sub-interfaces 52 respectively. The read circuit 30 reads, through the second transmission sub-interfaces 52, the stored data from the corresponding memory sub-arrays respectively, and transmits the read data to the data compression circuit 40.

In an embodiment, referring to FIG. 1 and FIG. 5, the data compression circuit 40 includes a first data compression circuit 41 and a second data compression circuit 42.

The first data compression circuit 41 is connected to the read circuit 30 and is configured to obtain, through each of the at least four first transmission sub-interfaces 51, data output by all corresponding second transmission sub-interfaces 52 and determine, for each of the corresponding second transmission sub-interface 52, whether data output by the second transmission sub-interface 52 are identical.

The second data compression circuit 42 is connected to the first data compression circuit 41 and is configured to determine whether data output by each two of the at least two second transmission sub-interfaces 52 are identical.

Specifically, referring to FIG. 5, the read circuit 30 reads respectively, through multiple second transmission sub-interfaces 52, the stored data from the memory sub-arrays corresponding to the first memory matrix group, and transmits the read data to the first data compression circuit 41. The first data compression circuit 41 compresses the stored data in the first memory matrix group for the first time, and compares the data output by each second transmission sub-interface 52 to determine whether the data of multiple memory cells output by the second transmission sub-interface 52 are identical. Specifically, in the first memory matrix group, it is determined whether the data of multiple memory cells in the first memory sub-array group 211 corresponding to all DQ0 are identical, whether the data of multiple memory cells in the second memory sub-array group 212 in the first memory matrix group corresponding to all DQ1 are identical, whether the data of multiple memory cells in the third memory sub-array group 213 corresponding to all DQ2 are identical, whether the data of multiple memory cells in the fourth memory sub-array group 214 corresponding to all DQ3 are identical. If it is determined that the data of multiple memory cells in at least one of the first memory sub-array group 211, the second memory sub-array group 212, the third memory sub-array group 213 and the fourth memory sub-array group 214 are not identical, the output circuit outputs a high-impedance state, which indicates that the memory array 20 is defective. If it is determined that the data of multiple memory cells in each of the memory sub-array groups are identical, further comparison is performed using the second data compression circuit 42.

The second data compression circuit 42 compresses the stored data in the first memory matrix group for the second time, and compares the data output by each two of the second transmission sub-interfaces 52 to determine whether the data output by the two of the second transmission sub-interfaces 52 are identical. Specifically, it is determined whether the data of multiple memory cells in each two memory sub-arrays among the first memory sub-array group 211, the second memory sub-array group 212, the third memory sub-array group 213 and the fourth memory sub-array group 214 are identical. For example, it is determined whether the data of the multiple memory cells in the first memory sub-array group 211 are identical to those in the second memory sub-array group 212, and whether the data of the multiple memory cells in the first memory sub-array group 211 are identical to those in the third memory sub-array group 213. If it is determined that the data of multiple memory cells in each two memory sub-array groups among the first memory sub-array group 211, the second memory sub-array group 212, the third memory sub-array group 213 and the fourth memory sub-array group 214 are identical, and the output data are identical to the initial data, the output circuit outputs "1", which indicates that the first memory matrix group is not defective. If it is determined that the data of multiple memory cells in at least two of the first memory sub-array group 211, the second memory sub-array group 212, the third memory sub-array group 213 and the fourth memory sub-array group 214 are not identical, the output circuit outputs "0", which indicates that the memory array is defective.

The same operations are performed on the remaining memory matrixes 21 in the memory array 20. If the data of the memory cells in each memory matrix 21 are identical, and the output data are identical with the initial data, the memory array 20 is not defective.

In an embodiment, the memory array detection circuit further includes a locating circuit 70. The locating circuit 70 is configured to locate and mark a defective memory cell in response to that the memory array 20 is defective.

The locating circuit is connected to the data compression circuit. In response to that the data compression circuit determines that the memory array is defective, the locating circuit locates a defective memory cell so as to repair the defective memory cell.

Figure 6:
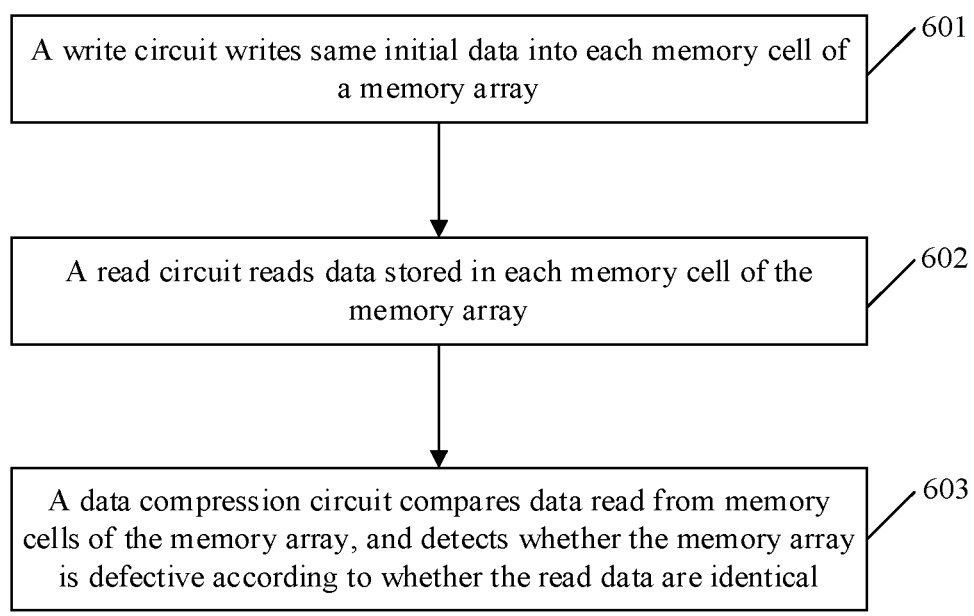
FIG. 6 illustrates a schematic flowchart of a memory array detection method according to embodiments of the disclosure.

Embodiments of the disclosure further provide a memory array detection method. Please refer to FIG. 6 for details. As illustrated in the FIG. 6, the method includes the following operations.

At an operation 601, a write circuit writes same initial data into each memory cell of a memory array.

At an operation 602, a read circuit reads data stored in each memory cell of the memory array.

At an operation 603, a data compression circuit compares data read from memory cells of the memory array, and detects whether the memory array is defective according to whether the read data are identical.

The memory array detection method according to the embodiments of the disclosure will be further described in detail below with reference to specific embodiments.

At first, referring to FIG. 1 and FIG. 3, the operation 601 is performed. The write circuit 10 writes the same initial data into each memory cell of the memory array 20.

Specifically, the write circuit 10 writes the data to the memory array 20 through the data transmission interface 50.

Next, the operation 602 is performed. The read circuit 30 reads the data stored in each memory cell of the memory array 20.

Specifically, the read circuit 30 reads the stored data from each memory cell of the memory array 20 through the data transmission interface 50.

Next, the operation 603 is performed. The data compression circuit 40 compares the data read from memory cells of the memory array, and detecting whether the memory array 20 is defective according to whether the read data are identical.

In the embodiments of the disclosure, the method for detecting whether the memory array is defective includes the following two implementations.

In some embodiments, as shown in FIG. 4, the memory array 20 includes multiple memory matrixes 21. Each of the memory matrixes 21 includes multiple memory sub-arrays 201. Each of the memory sub-arrays includes multiple memory cells. The write circuit 10 writes the initial data "0" to all the memory cells in the memory array 20 through the data transmission interface 50. All the memory sub-arrays are divided into at least four memory sub-array groups, and the data in the memory cells corresponding to each memory sub-array group are output through the same transmission sub-interface 501, and the number of transmission sub-interfaces 501 is identical to the number of memory sub-array groups.

Specifically, all the memory sub-arrays are divided into four groups which correspond to DQ0, DQ1, DQ2 and DQ3 respectively. All DQ0 correspond to the first memory sub-array group 211, all DQ1 correspond to the second memory sub-array group 212, all DQ2 correspond to the third memory sub-array group 213, and all DQ3 correspond to the fourth memory sub-array group 214. The first memory sub-array group 211, the second memory sub-array group 212, the third memory sub-array group 213, and the fourth memory sub-array group 214 are electrically connected to the corresponding transmission sub-interfaces 501 respectively. The read circuit 30 reads, through the transmission sub-interfaces 501, the stored data from the corresponding memory sub-arrays respectively, and transmits the read data to the data compression circuit 40.

In an embodiment, the data compression circuit 40 includes the first data compression circuit 41 and the second data compression circuit 42.

The first data compression circuit 41 compares the data output by each of the transmission sub-interfaces 501 to determine whether the data in multiple memory cells output by the transmission sub-interface 501 are identical.

In response to that the data in the multiple memory cells output by the transmission sub-interface are not identical, it is determined that the memory array 20 is defective. In response to that the data in the multiple memory cells output by each of the transmission sub-interfaces are identical, further comparison is performed by the second data compression circuit 42 by: for each two of the transmission sub-interfaces, comparing data output by the two of the transmission sub-interfaces 501 to determine whether the data output by the two of the transmission sub-interfaces 501 are identical. In response to that the data output by the two of the transmission sub-interfaces are not identical, it is determined that the memory array 20 is defective. In response to that the data output by each two of the transmission sub-interfaces are identical and the output data are identical to the initial data, it is determined that the memory array 20 is not defective.

Next, the memory array detection method further includes following operations. In response to that the first data compression circuit 41 determines that data in multiple memory cells are not identical, the output circuit 60 outputs a high-impedance state. In response to that the second data compression circuit 42 determines that data in multiple memory cells are not identical, the output circuit 60 outputs "0". In response to that the second data compression circuit 42 determines that data in multiple memory cells are iden-tical to each other, and are also identical to the initial data, the output circuit 60 outputs "1".

Specifically, referring to FIG. 4, the read circuit 30 reads, through multiple transmission sub-interfaces 501, stored data from the corresponding memory sub-arrays respectively, and transmits the read data to the first data compression circuit 41. The first data compression circuit 41 compresses the stored data for the first time, and compares the data output by each of the transmission sub-interfaces 501 to determine whether data of multiple memory cells output by the transmission sub-interface 501 are identical. Specifically, it is determined whether data of multiple memory cells in the first memory sub-array group 211 corresponding to all DQ0 are identical, whether data of multiple memory cells in the second memory sub-array group 212 corresponding to all DQ1 are identical, whether data of multiple memory cells in the third memory sub-array group 213 corresponding to all DQ2 are identical, and whether data of multiple memory cells in the fourth memory sub-array group 214 corresponding to all DQ3 are identical. If it is determined that data of multiple memory cells in at least one of the first memory sub-array group 211, the second memory sub-array group 212, the third memory sub-array group 213 and the fourth memory sub-array group 214 are not identical, the output circuit 60 outputs a high-impedance state which indicates that the memory array 20 is defective.

For example, if the data read out by all DQ0 are not all "0", it indicates that there is a defective memory cell in the first memory sub-array. Similarly, if the data read out by all DQ1, all DQ2 or all DQ3 are not all "0", it indicates that there are defective memory cells in the second memory sub-array group, the third memory sub-array group or the fourth memory sub-array group. At this time, the detection circuit outputs a high-impedance state.

If it is determined that the data of the multiple memory cells in each memory sub-array group are identical, further comparison is performed by the second data compression circuit 42. For example, if the data read out by all DQ0 are "0", the data read out by all DQ1 are "1", the data read out by all DQ2 are "0", and the data read out by all DQ3 are "0", that is, the data read out by each of DQ0, DQ1s, DQ2 or DQ3 are identical. At this time, whether the memory array is defective cannot be determined, and further comparison needs to be performed.

The second data compression circuit 42 compresses the stored data for the second time, and compares the data output by each two of the transmission sub-interfaces 501 to determine whether the data output by the two of the transmission sub-interfaces 501 are identical. Specifically, for example, if the data read out by all DQ0 are "0", the data read out by all DQ1 are "1", the data read out by all DQ2 are "0", and the data read out by all DQ3 are "0", that is, the data read from the first memory sub-array group 211, the third memory sub-array group 213, and the fourth memory sub-array group 214 are all "0" and are identical with the original written data, and the data read from the second memory sub-array group 212 is different from the data read from other three memory sub-array groups, it indicates that the second memory sub-array group 212 is defective. At this time, the output circuit outputs "0", indicating that the memory array is defective.

If the data read out by all DQ0, all DQ1, all DQ2, all DQ3 are "0", it indicates the data read from the first memory sub-array group 211, the second memory sub-array group 212, the third memory sub-array group 213, and the fourth memory sub-array group 214 are identical with the original written data, and then the output circuit outputs "1", which indicates that the memory array is not defective.

In some other embodiments, the memory array 20 includes multiple memory matrixes 21, and the multiple memory matrixes 21 are divided into at least four groups. Each group of the memory matrixes 21 outputs data through a first transmission sub-interface 51, and a number of first transmission sub-interfaces 51 is identical to a number of groups of the memory matrix 21.

Each of the multiple memory matrixes 21 includes multiple memory sub-arrays, and each of the multiple memory sub-arrays includes multiple memory cells. The write circuit 10 writes, through the first transmission sub-interfaces 51, initial data "1" to all the memory cells in the memory matrixes 21. The multiple memory sub-arrays in each memory matrix 21 are divided into at least four groups that output data through second transmission sub-interfaces 52 respectively. The second transmission sub-interfaces 52 are in one-to-one correspondence to the at least four memory sub-array groups.

Specifically, as shown in FIG. 5, the multiple memory matrixes 21 are divided into four groups. Each group of memory matrixes includes one memory matrix 21, and each memory matrix 21 is electrically connected to a respective first transmission sub-interface 51. The multiple memory sub-arrays in each memory matrix 21 are divided into four groups which correspond to DQ0, DQ1, DQ2 and DQ3 respectively. All DQ0 correspond to the first memory sub-array group 211, all DQ1 correspond to the second memory sub-array group 212, all DQ2 correspond to the third memory sub-array group 213, and all DQ3 correspond to the fourth memory sub-array group 214. The first memory sub-array group 211, the second memory sub-array group 212, the third memory sub-array group 213 and the fourth memory sub-array group 214 in each memory matrix 21 are electrically connected to corresponding second transmission sub-interfaces 52 respectively. The read circuit 30 reads, through the second transmission sub-interfaces 52, the stored data from the corresponding memory sub-arrays respectively, and transmits the read data to the data compression circuit 40.

In an embodiment, the data compression circuit 40 includes a first data compression circuit 41 and a second data compression circuit 42.

At operation a), the first data compression circuit 41 acquires, for a first memory matrix group through a corresponding first transmission sub-interface, data output by all corresponding second transmission sub-interfaces 52, and determines, for each of the corresponding second transmission sub-interfaces, whether data of multiple memory cells output by the second transmission sub-interface 52 are identical. At operation b) in response to that the data of the multiple memory cells output by the second transmission sub-interface are not identical, it is determined that the first memory matrix group is defective.

At operation c) in response to that the data of the multiple memory cells output by each of the corresponding second transmission sub-interfaces are identical, further comparison is performed by the second data compression circuit 42 by: comparing data output by each two of the corresponding second transmission sub-interfaces 52 to determine whether the data output by the two of the corresponding second transmission sub-interfaces 52 are identical. At operation d) in response to that the data output by the two of the corresponding second transmission sub-interfaces are not identical, it is determined that the first memory matrix is defective. At operation e) response to that the data output by each two of the corresponding second transmission sub-interfaces are identical and the output data are identical to the initial data, it is determined that the first memory matrix is not defective.

Same operations a)-e) are performed for the remaining memory matrixes 21 in the memory array 20. In response to that data in memory cells of all memory matrixes 21 of the memory array are identical and the output data are identical to the initial data, determining that the memory array 20 is not defective.

Specifically, referring to FIG. 5, the read circuit 30 reads, through the multiple second transmission sub-interfaces 52 respectively, the stored data from the memory sub-arrays corresponding to the first memory matrix group, and transmits the read data to the first data compression circuit 41. The first data compression circuit 41 compresses the stored data in the first memory matrix group for the first time, and compares the data output by each second transmission sub-interface 52 to determine whether the data of the multiple memory cells output by the second transmission sub-interface 52 are identical. Specifically, in the first memory matrix group, it is determined whether the data of multiple memory cells in the first memory sub-array group 211 corresponding to all DQ0 are identical, whether the data of multiple memory cells in the second memory sub-array group 212 corresponding to all DQ1 are identical, whether the data of multiple memory cells in the third memory sub-array group 213 corresponding to all DQ2 are identical, and whether the data of the multiple memory cells in the fourth memory sub-array group 214 corresponding to all DQ3 are identical. If it is determined that the data of multiple memory cells in at least one of the first memory sub-array group 211, the second memory sub-array group 212, the third memory sub-array group 213 and the fourth memory sub-array group 214 are not identical, the output circuit outputs a high-impedance state, which indicates that the memory array 20 is defective. For example, if the data read out by all DQ0 are not all "1", it indicates that there is a defective memory cell in the first memory sub-array. Similarly, if the data read out by all DQ1, all DQ2 or all DQ3 are not all "1", it indicates that there are defective memory cells in the second memory sub-array group, the third memory sub-array group or the fourth memory sub-array group. At this time, the detection circuit outputs a high-impedance state.

If it is determined that the data of the multiple memory cells in each memory sub-array group are identical, further comparison is performed using the second data compression circuit 42. For example, if the data read out by all DQ0 are "1", the data read out by all DQ1 are "1", the data read out by all DQ2 are "0", and the data read out by all DQ3 are "1", that is, the data read out by DQ0, DQ1, DQ2 or DQ3 are identical respectively, whether the memory array is defective cannot be determined at this time, and further comparison needs to be performed.

The second data compression circuit 42 compresses the stored data in the first memory matrix group for the second time, and compares the data output by each two of the second transmission sub-interfaces 52 to determine whether the data output by the two of the second transmission sub-interfaces 52 are identical. Specifically, for example, if the data read out by all DQ0 are "1", the data read out by all DQ1 is "1", the data read out by all DQ2 is "0", and the data read out by all DQ3 is "1", that is, the data read from the first memory sub-array group 211, the second memory sub-array group 212, and the fourth memory sub-array group 214 are all "1" and are identical with the original written data, and the data read from the third memory sub-array group 213 is different from the data read from other three memory sub-array groups, it indicates that the third memory sub-array group 212 is defective. At this time, the output circuit outputs "0", indicating that the memory array is defective.

If the data read by all DQ0, DQ1, DQ2, DQ3 are "1", it indicates the data read from the first memory sub-array group 211, the second memory sub-array group 212, the third memory sub-array group 213, and the fourth memory sub-array group 214 are identical with the original written data, and then the output circuit outputs "1", which indicates that the memory array is not defective.

The same operation is performed on the remaining memory matrixes 21 in the memory array 20. If the data of the memory cells in each memory matrix 21 are identical, and the output data are identical with the initial data, then the memory array 20 is not defective.

Next, the method for detecting the memory array further includes an operation that a locating circuit 70 locates and marks a defective memory cell in response to that the memory array 20 is defective.

The locating circuit is connected to the data compression circuit; and when the data compression circuit determines that the memory array is defective, the locating circuit locates a defective memory cell so as to repair the defective memory cell.

Embodiments of the disclosure further provide a memory, including the memory array detection circuit according to any one of the foregoing embodiments.

Described above are only preferred embodiments of the disclosure, and are not intended to limit the protection scope of the disclosure. Any modifications, equivalent replacements and improvements made within the spirit and principles of the disclosure shall be included in the within the scope of the disclosure.

For example, in some embodiments of the disclosure, same initial data is written into each memory cell of the memory array at first, and then the data in each memory cell of the memory array is read. The read data are compared by the data compression circuit, and whether a defect exists in the memory array is determined according to a comparison result, so as to correct the defect.

What is claimed is:

1. A memory array detection circuit, comprising:
    a memory array comprising multiple memory cells;
    a write circuit, connected to the memory array and configured to write same initial data into each memory cell of the memory array;
    a read circuit, connected to the memory array and configured to read data stored in each memory cell of the memory array; and
    a data compression circuit, connected to the read circuit and configured to: compare data read from the multiple memory cells, and detect whether the memory array is defective according to whether the read data are identical;
    wherein the memory array detection circuit further comprises: a data transmission interface through which the stored data is read, wherein the data transmission interface comprises at least four transmission sub-interfaces; and the memory array comprises multiple memory matrixes, each of the multiple memory matrixes comprises multiple memory sub-arrays, and each of the multiple memory sub-arrays comprises multiple memory cells, wherein all memory sub-arrays of the memory array are divided into at least four memory sub-array groups electrically connected to the at least four transmission sub-interfaces in one-to-one correspondence; wherein the data compression circuit comprises a first data compression circuit and a second data compression circuit; the first data compression circuit is connected to the read circuit, and is configured to determine, for each of the at least four transmission sub-interfaces, whether data of multiple memory cells output by the transmission sub-interface are identical; and the second data compression circuit is connected to the first data compression circuit, and is configured to determine whether data output by each two of the at least four transmission sub-interfaces is identical;
    or
    wherein the memory array detection circuit further comprises: a data transmission interface through which the stored data is read, wherein the data transmission interface comprises at least four first transmission sub-interfaces, and each first transmission sub-interface comprises at least four second transmission sub-interfaces; and the memory array comprises multiple memory matrixes that are divided into at least four memory matrix groups electrically connected to the at least four first transmission sub-interfaces in one-to-one correspondence; each of the multiple memory matrixes comprises multiple memory sub-arrays, and each of the multiple memory sub-arrays comprises multiple memory cells; and multiple memory sub-arrays in each of the multiple memory matrixes are divided into at least four memory sub-array groups electrically connected to corresponding second transmission sub-interfaces in one-to-one correspondence; wherein the data compression circuit comprises a first data compression circuit and a second data compression circuit; the first data compression circuit is connected to the read circuit and is configured to: obtain, through each of the at least four first transmission sub-interfaces, data output by all corresponding second transmission sub-interfaces, and determine, for each of the corresponding second transmission sub-interfaces, whether data output by the second transmission sub-interface are identical; and the second data compression circuit is connected to the first data compression circuit and is configured to determine whether data output by each two of the at least two second transmission sub-interfaces are identical.

2. The memory array detection circuit of claim 1, further comprising:
    an output circuit, connected to the first data compression circuit and the second data compression circuit, and configured to output three states according to determination results of the first data compression circuit and the second data compression circuit.

3. The memory array detection circuit of claim 1, further comprising:
    a locating circuit, configured to locate and mark a defective memory cell in response to that the memory array is defective.

4. A memory, comprising the memory array detection circuit of claim 1.

5. A memory array detection method, comprising:
    writing, by a write circuit, same initial data into each memory cell of the memory array;
    reading, by a read circuit, data stored in each memory cell of the memory array;
    comparing, by a data compression circuit, data read from memory cells of the memory array, and detecting whether the memory array is defective according to whether the read data are identical;

wherein the memory array comprises multiple memory matrixes, each of the multiple memory matrixes comprises multiple memory sub-arrays, and each of the multiple memory sub-arrays comprises multiple memory cells; all memory sub-arrays in the memory array are divided into at least four memory sub-array groups, data in memory cells corresponding to each of the at least four memory sub-array groups are output through a same transmission sub-interface, and a number of transmission sub-interfaces is identical to a number of the at least four memory sub-array groups;

wherein the data compression circuit comprises a first data compression circuit and a second data compression circuit, and the method further comprises:

comparing, by the first data compression circuit for each of the transmission sub-interfaces, data output by the transmission sub-interface to determine whether data in multiple memory cells output by the transmission sub-interface are identical;

in response to that the data in the multiple memory cells output by the transmission sub-interface are not identical, determining that the memory array is defective;

in response to that the data in the multiple memory cells output by each of the transmission sub-interfaces are identical, performing further comparison by the second data compression circuit by: for each two of the transmission sub-interfaces, comparing data output by the two of the transmission sub-interfaces to determine whether the data output by the two of the transmission sub-interfaces are identical;

in response to that the data output by the two of the transmission sub-interfaces are not identical, determining that the memory array is defective; and in response to that the data output by each two of the transmission sub-interfaces are identical and the output data are identical to the initial data, determining that the memory array is not defective.

6. The method of claim 5, further comprising:
in response to that the first data compression circuit determines that data in multiple memory cells are not identical, outputting, by an output circuit, a high-impedance state;
in response to that the second data compression circuit determines that data in multiple memory cells are not identical, outputting, by the output circuit, "0"; and
in response to that the second data compression circuit determines that data in multiple memory cells are identical and are identical to the initial data, outputting, by the output circuit, "1".

7. The method of claim 5, further comprising:
in response to that the memory array is defective, locates and marks, by a locating circuit, a defective memory cell.

8. A memory array detection method, comprising:
writing, by a write circuit, same initial data into each memory cell of the memory array;
reading, by a read circuit, data stored in each memory cell of the memory array;
comparing, by a data compression circuit, data read from memory cells of the memory array, and detecting whether the memory array is defective according to whether the read data are identical;
wherein the memory array comprises multiple memory matrixes that are divided into at least four memory matrix groups, each of the at least four memory matrix groups outputs data through a respective first transmission sub-interface, a number of first transmission sub-interfaces is identical to a number of the at least four memory matrix groups; and each of the multiple memory matrixes comprises multiple memory sub-arrays, and each of the multiple memory sub-arrays comprises multiple memory cells; the multiple memory sub-arrays in each of the multiple memory matrixes are divided into at least four memory sub-array groups that output data through second transmission sub-interfaces respectively, and the second transmission sub-interfaces are in one-to-one correspondence to the at least four memory sub-array groups;

wherein the data compression circuit comprises a first data compression circuit and a second data compression circuit, and the method further comprises:

operation a) acquiring, for a first memory matrix group through a corresponding first transmission sub-interface by the first data compression circuit, data output by all corresponding second transmission sub-interfaces, and determining, for each of the corresponding second transmission sub-interfaces, whether data of multiple memory cells output by the second transmission sub-interface are identical;

operation b) in response to that the data of the multiple memory cells output by the second transmission sub-interface are not identical, determining that the first memory matrix group is defective;

operation c) in response to that the data of the multiple memory cells output by each of the corresponding second transmission sub-interfaces are identical, performing further comparison by the second data compression circuit by: comparing data output by each two of the corresponding second transmission sub-interfaces to determine whether the data output by the two of the corresponding second transmission sub-interfaces are identical;

operation d) in response to that the data output by the two of the corresponding second transmission sub-interfaces are not identical, determining that the first memory matrix is defective;

operation e) in response to that the data output by each two of the corresponding second transmission sub-interfaces are identical and the output data are identical to the initial data, determining that the first memory matrix is not defective;

performing same operations a) to e) for remaining memory matrixes in the memory array other than the first memory matrix;

operation f) in response to that data in memory cells of all memory matrixes of the memory array are identical and the output data are identical to the initial data, determining that the memory array is not defective.

9. The method of claim 8, further comprising:
in response to that the first data compression circuit determines that data in multiple memory cells are not identical, outputting, by an output circuit, a high-impedance state;
in response to that the second data compression circuit determines that data in multiple memory cells are not identical, outputting, by the output circuit, "0"; and
in response to that the second data compression circuit determines that data in multiple memory cells are identical and are identical to the initial data, outputting, by the output circuit, "1".

10. The method of claim 8, further comprising:
 in response to that the memory array is defective, locates and marks, by a locating circuit, a defective memory cell.

* * * * *